United States Patent
Kojima et al.

(10) Patent No.: US 7,827,932 B2
(45) Date of Patent: Nov. 9, 2010

(54) VAPORIZER AND PROCESSOR

(75) Inventors: Yasuhiko Kojima, Nirasaki (JP);
Tomohisa Hoshino, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 619 days.

(21) Appl. No.: 11/813,878

(22) PCT Filed: Jan. 13, 2006

(86) PCT No.: PCT/JP2006/300383
§ 371 (c)(1),
(2), (4) Date: Jul. 13, 2007

(87) PCT Pub. No.: WO2006/075709
PCT Pub. Date: Jul. 20, 2006

(65) Prior Publication Data
US 2009/0000740 A1 Jan. 1, 2009

(30) Foreign Application Priority Data
Jan. 14, 2005 (JP) ............................. 2005-008429

(51) Int. Cl.
*C23C 16/448* (2006.01)
*C23F 1/00* (2006.01)
*H01L 21/306* (2006.01)
*C23C 16/06* (2006.01)
*C23C 16/22* (2006.01)

(52) U.S. Cl. ............................. 118/723 VE; 118/726; 156/345.33

(58) Field of Classification Search ........... 118/723 VE, 118/723; 156/345.33
See application file for complete search history.

(56) References Cited

U.S. PATENT DOCUMENTS

| 2,896,658 | A | * | 7/1959 | Jones ........................ 137/340 |
| 6,224,681 | B1 | * | 5/2001 | Sivaramakrishnan et al. ........................ 118/726 |
| 7,332,040 | B1 | | 2/2008 | Kojima et al. |
| 2002/0017246 | A1 | * | 2/2002 | Kojima et al. ............... 118/726 |

FOREIGN PATENT DOCUMENTS

| JP | 2000204472 | 7/2000 |
| JP | 2001148347 | 5/2001 |
| JP | 2001262350 | 9/2001 |
| JP | 2002217181 | 8/2002 |
| JP | 2003-347289 | 12/2003 |
| WO | WO 2005112081 A1 * | 11/2005 |

* cited by examiner

*Primary Examiner*—Rudy Zervigon
(74) *Attorney, Agent, or Firm*—Oblon, Spivak, McClelland, Maier & Neustadt, L.L.P.

(57) ABSTRACT

A vaporizer vaporizes a force-fed liquid source material in a depressurized atmosphere to generate a source gas and discharging the source gas together with a carrier gas. The vaporizer includes a liquid reservoir chamber for temporarily storing the force-fed liquid source material; and a vaporization chamber communicating with the liquid reservoir chamber via a valve port. Further, the vaporizer includes a valve body adapted to sit on a valve seat surrounding the valve port of the liquid reservoir chamber; an actuator for driving the valve body; a carrier gas injection hole formed at a side of the valve body facing the valve port; and a discharge port for discharging the source gas from the vaporization chamber. By virtue of a specific arrangement of the carrier gas injection hole, the liquid source material is prevented from remaining unvaporized at a downstream side of the valve port.

10 Claims, 5 Drawing Sheets

VAPORIZER AND PROCESSOR

FIELD OF THE INVENTION

The present invention relates to a processor for performing a specific treatment, e.g., a film forming process or the like, on a target object, e.g., a semiconductor wafer or the like and a vaporizer for vaporizing a liquid source material for use in the specific treatment.

BACKGROUND OF THE INVENTION

In general, in order to manufacture a semiconductor integrated circuit or the like, a target object such as a semiconductor wafer or the like is repeatedly subjected to various processes such as a film forming process, an etching process, an oxidation/diffusion process, a reduction process and the like. Recently, various metal films such as Ta, Ti, Cu and the like are formed by the film forming process. In order to form such metal films, there is widely used a liquid source material having a low vapor pressure and a liquid state at room temperature and one atmospheric pressure. The liquid source material is force-fed to a vaporizer and then is vaporized therein by being heated in a depressurized atmosphere, thus becoming a source gas. The source gas is supplied together with a carrier gas into a depressurized processing chamber. Then, a metal thin film is deposited on a semiconductor wafer accommodated in the processing chamber by CVD (chemical vapor deposition).

An example of the vaporizer is disclosed in JP2001-148347A. In this vaporizer, a force-fed liquid source material at a controlled flow rate is introduced via a valve port into a heated vaporization chamber set in a depressurized atmosphere and then is vaporized therein, the valve port being opened and closed by a valve body. Simultaneously, a carrier gas is supplied into the vaporization chamber, thereby facilitating atomization of the liquid source material to increase a total surface area thereof. As a result, vaporization of the liquid source material is facilitated, enabling efficient generation of the source gas.

In the above-described vaporizer, the liquid source material should not remain in a downstream space of the valve port when the vaporization is stopped. However, when the carrier gas is supplied into the vaporization chamber as described above, there exists a small amount of so called dead space, i.e., an area where the carrier gas does not reach sufficiently. The liquid source material coming into the dead space is not vaporized readily so that it may remain unvaporized in the vaporization chamber even after finishing the operation of the vaporizer. In case the liquid source material is an organic metal complex having low thermal stability, the liquid source material remaining in the vaporization chamber is thermally decomposed therein to become deposits.

If fragments of the deposits are discharged from the vaporization chamber, they clog downstream passages and then are introduced as particles into the processing chamber. As a result, a production yield and reproducibility of the CVD process deteriorate.

SUMMARY OF THE INVENTION

The present invention has been developed to effectively solve the aforementioned drawbacks. It is, therefore, an object of the present invention to prevent a liquid source material from remaining in a vaporization chamber of a vaporizer.

In accordance with the present invention, there is provided:
a vaporizer for vaporizing a force-fed liquid source material in the depressurized atmosphere to generate a source gas and discharging the source gas together with a carrier gas, the vaporizer including: a liquid reservoir chamber for temporarily storing the force-fed liquid source material; a vaporization chamber communicating with the liquid reservoir chamber via a valve port; a valve body adapted to sit on a valve seat surrounding the valve port of the liquid reservoir chamber; an actuator for driving the valve body; a carrier gas injection hole formed at the valve body facing the valve port; and a discharge port for discharging the source gas from the vaporization chamber.

Since the carrier gas injection hole is provided at the valve body for opening/closing the valve port communicating with the vaporization chamber, the liquid source material supplied from the valve port to the vaporization chamber can be effectively atomized by the injected carrier gas. Therefore, the liquid source material can be almost completely vaporized and also prevented from remaining in a downstream space of the valve body in the vaporizer. As a result, it is possible to avoid the generation of particles, the clogging of the passages and the deterioration of the process reproducibility and further to improve the production yield of the products.

Preferably, the carrier gas injection hole is disposed to face the valve port even when the valve body sits on the valve seat.

In accordance with a preferred embodiment of the present invention, the vaporization chamber is disposed such that an injection direction of the carrier gas injected from the carrier gas injection hole is directed toward the vaporization chamber.

In accordance with the preferred embodiment of the present invention, the valve port is connected with the vaporization chamber via a mixing channel, and the liquid source material is mixed with the carrier gas and atomized in the mixing channel. In this case, an orifice plate is preferably installed in the mixing channel.

In accordance with the preferred embodiment of the present invention, the valve body is connected with a valve bar having therein a carrier gas channel, through which the carrier gas supplied to the carrier gas injection hole flows Further, the valve body may be a diaphragm made up of a bendable thin metal plate.

Further, in accordance with the present invention, there is provided:
a processing apparatus for performing a specific process on a target object under a depressurized atmosphere, the processing apparatus including: a vacuum exhaustable processing chamber; a mounting table for mounting thereon the target object; a heating unit for heating the target object; and the above-described vaporizer for supplying the source gas to the processing chamber.

Figure 1:
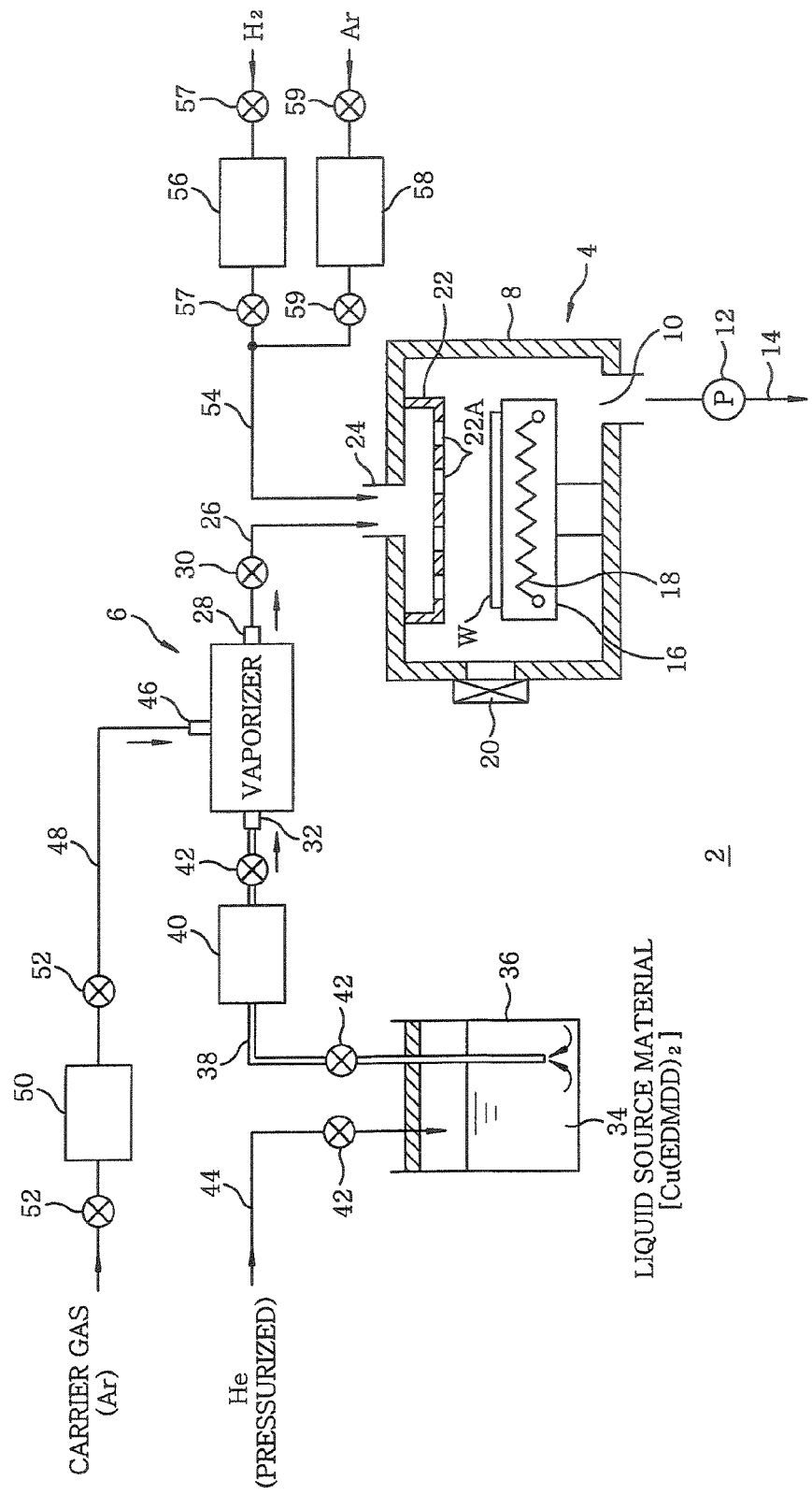
FIG. 1 is a schematic system diagram showing an entire configuration of a film forming apparatus in accordance with the present invention.

DESCRIPTION OF REFERENCE NUMERAL 2 film forming apparatus
4 chamber
6 vaporizer
8 processing chamber
16 mounting table
18 heating unit
22 shower head (gas introduction unit)
26 source gas channel
28 discharge port
32 source material inlet
36 source material tank
46 carrier gas inlet
60 housing
62 vaporization chamber
65 mixing area
66 valve port
67 orifice plate
68 valve seat
70 liquid reservoir chamber
72 valve body
74 diaphragm
81 actuator
84 valve bar
90 carrier gas introduction unit
92 carrier gas injection hole
100 vaporization chamber heating unit
102 preheating unit
W semiconductor wafer (target object)

DETAILED DESCRIPTION OF THE EMBODIMENTS

Figure 2:
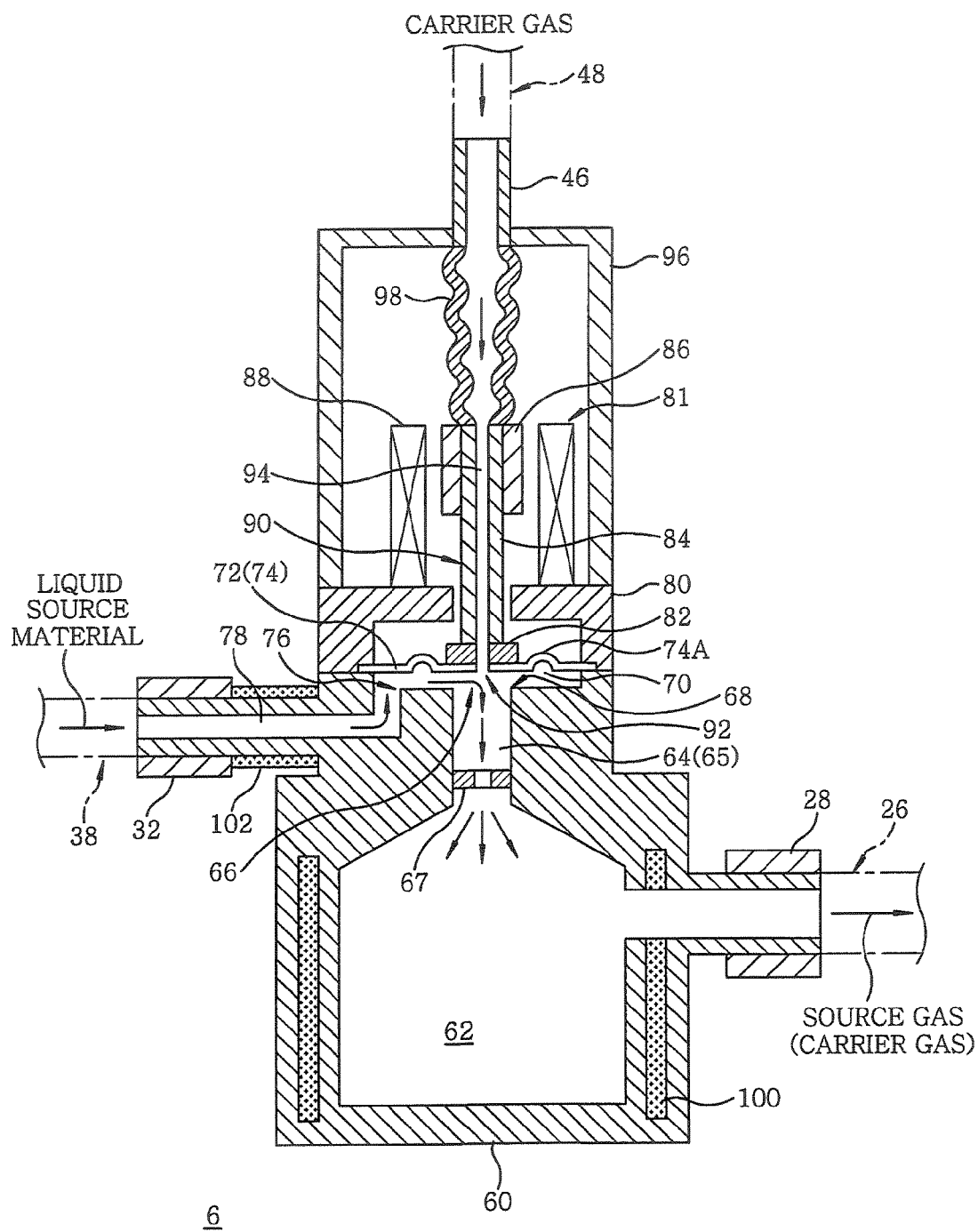
FIG. 2 describes a cross sectional view illustrating a structure of a vaporizer in accordance with the present invention.
Figure 3:
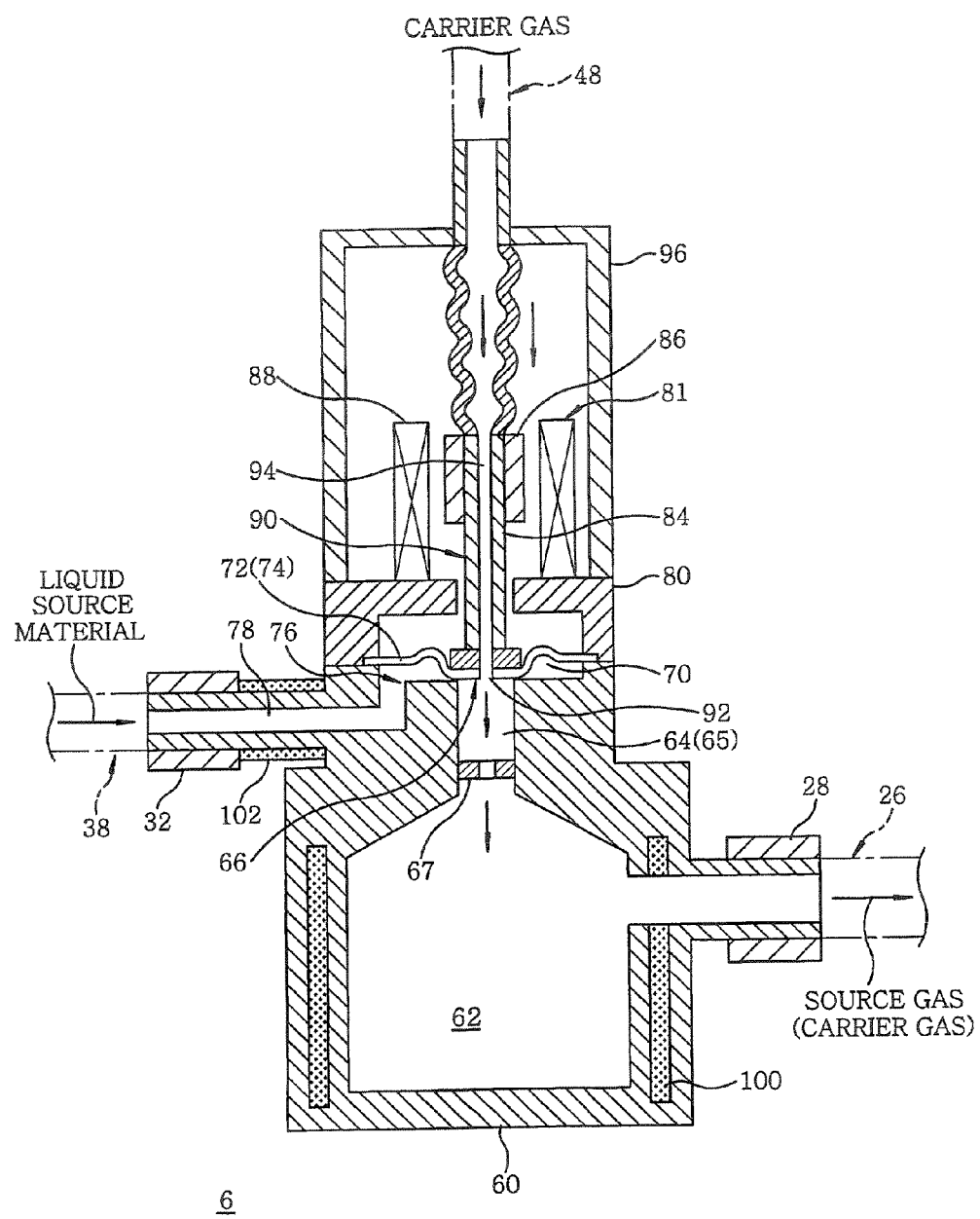
FIG. 3 provides a cross sectional view showing a state where a valve port is closed by a valve body in the vaporizer of FIG. 2.
Figure 4:
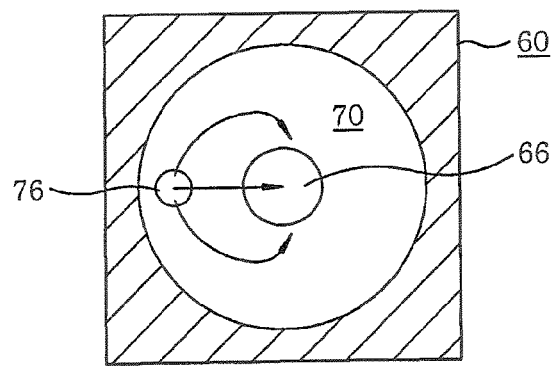
FIG. 4 presents a top view of a liquid reservoir chamber of the vaporizer of FIG. 2.
Figure 5:
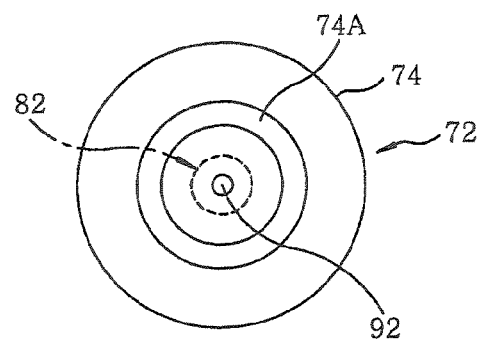
FIG. 5 represents a bottom view of the valve body of the vaporizer of FIG. 2.

Hereinafter, a vaporizer and a processing apparatus in accordance with an embodiment of the present invention will be described with reference to the accompanying drawings. FIG. 1 is a schematic system diagram showing an entire configuration of a film forming apparatus, which is one example of the processing apparatus of the present invention. FIG. 2 describes a cross sectional view illustrating a structure of the vaporizer of the present invention. FIG. 3 provides a cross sectional view showing the vaporizer of FIG. 2 in the state that a valve port is closed by a valve body. FIG. 4 presents a top view of a liquid reservoir chamber of the vaporizer of FIG. 2; and FIG. 5 represents a bottom view of the valve body of the vaporizer of FIG. 2.

To begin with, the entire configuration of a film forming apparatus will be described with reference to FIG. 1. The film forming apparatus illustrated herein is for forming a Cu film as a metal film through a CVD process by using a liquid source material made of an organometallic compound containing Cu. A film forming apparatus 2 mainly includes a processing chamber 4 for performing a film forming process on a semiconductor wafer W serving as a target object; and a vaporizer 6 for vaporizing the liquid source material in order to supply a source gas to the processing chamber 4.

The processing chamber 4 is constructed as a cylindrical processing chamber 8 made of aluminum or the like. A gas exhaust port 10, formed on a bottom portion of the processing chamber 8, is connected to a vacuum exhaust system 14 having a vacuum pump 12. Accordingly, an inside of the processing chamber 8 can be exhausted to vacuum and set in a depressurized atmosphere. Further, the processing chamber 8 has therein a mounting table 16 for mounting thereon a semiconductor wafer W. Since the mounting table 16 has a heater, i.e., a heating unit 18, therein, the wafer W mounted on the mounting table 16 can be heated to a specific temperature. As for the heating unit 18, a heating lamp may be used.

Provided on a sidewall of the processing chamber 8 is a gate valve 20 being opened and closed when loading and unloading the wafer W into and from the processing chamber 8. Disposed on a ceiling portion of the processing chamber 8 is a shower head 22 serving as a gas introduction unit for introducing a source gas into the processing chamber 8. The shower head 22 can inject the source gas into the processing chamber 8 through a plurality of gas injection holes 22A provided on a gas injection surface, which is a bottom surface of the shower head 22. The shower head 22 is configured to supply other gases in addition to the source gas, such as Ar gas and $H_2$ gas required for the film forming process.

The shower head 22 has a gas inlet 24 connected with a source gas passage 26. An upstream end of the source gas passage 26 is connected to a discharge port 28 of the vaporizer 6. Installed an the source gas passage 26 is an opening/closing valve 30 for blocking a flow of the source gas. In order to prevent the source gas from being reliquefied, a tape heater or the like for heating the source gas passage 26 can be coiled therearound.

Through a liquid flow path 38, a source material inlet 32 of the vaporizer 6 is connected to an inside of a source material tank 36 for storing therein a liquid source material 34 for film formation. Installed on the liquid flow path 38 are a liquid flow rate controller 40 for controlling a flow rate of the liquid source material and two opening/closing valves 42 positioned at both sides of the liquid flow rate controller 40. The leading end portion of the liquid flow path 38 is immersed in the liquid source material 34 in the source material tank 36. Inserted into a sealed inner space of the source material tank 36 is the leading end portion of a force-feed gas passage 44 on which an opening/closing valve 42 is installed. In the embodiment illustrated herein, a pressurized inert gas, e.g., He gas is used as a force-feeding gas. The liquid source material 34 in the source material tank 36 is force-fed to the vaporizer 6 by the pressurized He gas. Further, $Cu(EDMDD)_2$ is used for the liquid source material 34 in the embodiment illustrated herein.

A carrier gas inlet 46 of the vaporizer 6 is connected with a carrier gas passage 48. Installed on the carrier gas passage 48 are a flow rate controller 50 such as a mass flow controllers or the like and two opening/closing valves 52 positioned at both sides of the flow rate controller 50. As for a carrier gas, an inert gas, e.g., Ar gas, can be used.

The gas inlet 24 of the shower head 22 is connected with a gas passage 54 for supplying other gases required for the film forming process. In the illustrated embodiment, the gas passage 54 is bifurcated into two branch passages. Installed on the branch passages are flow rate controllers 56 and 58 such as mass flow controllers or the like and opening/closing valves 57 and 59 positioned at both sides of the flow rate controllers. In the illustrated embodiment, $H_2$ gas and Ar gas can be supplied when necessary.

Hereinafter, a structure of the vaporizer 6 will be described with reference to FIGS. 2 to 5. As can be seen from FIGS. 2 and 3, the vaporizer 6 has a relatively large vaporization chamber 62 encased by a housing 60. The housing 60 can be made of stainless steel or aluminum. Provided on a sidewall of the housing 60 is the discharge port 28 for discharging the source gas generated in the vaporization chamber. The discharge port 28 is connected with the source gas passage 26. A ceiling portion of the vaporization chamber 62 has a cone shaped inner wall surface. Integrally formed with the vaporization chamber 62 at the ceiling portion thereof is a mixing channel 64 extending slightly upward therefrom. An upper opening of the mixing channel 64 serves as a valve port 66; and a portion of the housing 60 surrounding the valve port 66 to define the periphery of the valve port 66 serves as a valve seat 68. In the illustrated embodiment, an inner diameter of the mixing channel 64 is substantially the same as that of the valve port 66 and is smaller than that of the vaporization chamber 62. An inner space of the mixing channel 64 serves as a mixing area 65 for atomizing the liquid source material by mixing same with the carrier gas. Installed in the mixing channel 64 is an orifice plate 67 having a fine hole.

Formed above the valve port 66 is a liquid reservoir chamber 70 for temporarily storing therein the liquid source material force-fed to the vaporizer 6. A ceiling portion of the liquid reservoir chamber 70 is partitioned by a bendable valve body 72. When the valve port 66 is opened by the valve body 72, the liquid reservoir chamber 70 communicates with the vaporization chamber 62 via the valve port 66. The valve body 72 can be formed by a circular diaphragm 74 (see FIG. 5) made of a thin metal plate. Since a ring-shaped corrugation 74A is formed at the diaphragm 74, the diaphragm 74 can be deformed to seal the valve port 66, as illustrated in FIG. 3.

As shown in FIG. 4, the valve port 66 is positioned at a central portion of a bottom part of the liquid reservoir chamber 70. Formed at a peripheral portion of the bottom part of the liquid reservoir chamber 70 is a source material inlet opening 76 for introducing the liquid source material into the liquid reservoir chamber 70. As depicted in FIG. 3, the source material inlet opening 76 is connected with a liquid introduction path 78 extending to the outside through the inner part of the housing 60. A leading end portion of the liquid introduction path 78 is formed as the source material inlet 32. Since the source material inlet 32 is connected with the liquid flow path 38, the liquid source material force-fed via the liquid flow path 38 is supplied to the liquid reservoir chamber 70 via the source material inlet 32.

A peripheral portion of the circular diaphragm 74 is airtightly fixed by being inserted between a housing cover 80 having a ring-shaped downward protrusion and an upper portion of the housing 60. The diaphragm 74 is connected with an actuator 81 for vertically moving the diaphragm 74. In the illustrated embodiment, the actuator 81 is configured as an electromagnetic actuator. A pipe-shaped valve bar 84 extending upward is connected with a central portion of an upper surface of the diaphragm 74 via an attaching member 82. The valve bar 84 extends upward through a central opening of the housing cover 80 having an inner diameter greater than an outer diameter of the valve bar 84. A magnetic body 86 is attached to an upper portion of the valve bar 84. Further, an electric coil 88 surrounds the magnetic body 86 and the valve bar 84. By making a controlled current flow in the electric coil 88, the valve bar 84 can be vertically moved within a specific stroke range. An upward force is constantly applied to the valve bar 84 by a bias unit (not shown). Therefore, when an electric power is not applied to the electric coil 88, the valve port 66 is completely opened (i.e., normally open) Alternatively, a downward force can be constantly applied to the valve bar 84 by the bias unit (not shown). In such a case, when an electric power is not applied to the electric coil 88, the valve port 66 is completely closed (i.e., normally closed).

In the vaporizer 6, a carrier gas introduction unit 90 for introducing a carrier gas is provided at a portion of the diaphragm 74 forming the valve body 72. The carrier gas introduction unit 90 has a carrier gas injection hole 92 formed of a fine hole disposed at the central portion of the diaphragm 74. A carrier gas channel 94 extends through the attaching member 82 and the valve bar 84 to communicate with the carrier gas injection hole 92. The actuator 81 is covered by a covering member 96. A carrier gas inlet 46 is attached to an upper portion of the covering member 96 and connected with an upper end portion of the valve bar 84, through which the carrier gas channel 94 is formed, via an expansible/contractible metal bellows 98. The carrier gas supplied through the carrier gas passage 48 flows through the bellows 98 and the carrier gas channel 94 in the valve bar 84 and then is injected downward, i.e., directly toward the valve port 66, from the carrier gas injection hole 92.

In the illustrated embodiment, the carrier gas injection hole 92 is disposed to constantly face the valve port 66. Especially, even when the valve port 66 is closed by the diaphragm 74 sitting on the valve seat 68, the carrier gas injection hole 92 is arranged to face the valve port 66.

Furthermore, in the illustrated embodiment, the vaporization chamber 62 is formed to become wider along the injection direction of the carrier gas injected from the carrier gas injection hole 92, which facilitates the atomization of the liquid source material and increases the vaporization efficiency.

The housing 60 surrounding the vaporization chamber 62 is provided with a vaporization chamber heater, i.e., a vaporization chamber heating unit 100, for facilitating vaporization of the atomized source material by heating the vaporization chamber 62. Moreover, a heater for preheating the liquid source material supplied from the source material inlet 32, i.e., the preheating unit 102, is provided near the source material inlet 32 of the liquid introduction path 78, thereby increasing the vaporization efficiency of the liquid source material.

The following is an explanation of a film forming method executed by using the above-described film forming apparatus.

First of all, an overall flow of the film forming method will be described with reference to FIG. 1. A semiconductor wafer W as a target object is accommodated in the processing chamber 8 and mounted on the mounting table 16. Next, a temperature inside the processing chamber 8 is maintained at a specific process temperature, e.g., ranging from about 100° C. to about 300° C., by the heating unit 18.

Further, an inside of the processing chamber 8 is exhausted to vacuum by the vacuum exhaust system 14 and maintained under a specific depressurized atmosphere, e.g., ranging from about 10 Pa to about 500 Pa. Thus, an inside of the vaporization chamber 62 of the vaporizer 6 which communicates with the processing chamber 8 is also set in the depressurized atmosphere. Then, in order to form a metal film, a source gas formed of $Cu(EDMDD)_2$ is supplied from the shower head 22 into the processing chamber 8. The source gas is thermally decomposed and reacts with $H_2$ gas that is simultaneously supplied, thus depositing a Cu thin film on the wafer W by a CVD process.

Hereinafter, generation and supply of a source gas will be explained. First, a pressurized He gas is supplied into the source material tank 36 via the force-feed gas passage 44, so that the liquid source material 34 in the source material tank 36 is sent to the liquid flow path 38. The liquid source material 34 flows through the liquid flow path 38 at a flow rate controlled by the liquid flow rate controller 40. The liquid source material 34 is then flows into the inside of the vaporizer 6 through the source material inlet 32 and vaporized therein in the depressurized atmosphere to become a source gas. The source gas is discharged from the discharge port 28 to the source gas passage 26 together with the carrier gas that has flown into the vaporizer 6. The source gas and the carrier gas flow through the source gas passage 26 and reach to the shower head 22 to be supplied into the processing chamber 8.

Hereinafter, an operation of the vaporizer 6 will be described with reference to FIGS. 2 and 3. FIG. 2 shows a state where the valve port 66 is opened at a specific opening degree, whereas FIG. 3 describes a state where the liquid source material does not flow due to the completely closed valve port 66.

As illustrated in FIG. 2, the force-fed liquid source material at a controlled flow rate is introduced into the liquid reservoir chamber 70 via the source material inlet 32 and the liquid introduction path 78. Before the liquid source material is introduced into the liquid reservoir chamber 70, it is preheated to a specific temperature by the preheating unit 102 to thereby facilitate the vaporization.

The liquid source material introduced into the liquid reservoir chamber 70 flows into the valve port 66 provided at a central portion of the liquid reservoir chamber 70, passes through the mixing channel 64 and the orifice plate 67 and then reaches the vaporization chamber 62 in the depressurized atmosphere and heated by the vaporization chamber heating unit 100 to be vaporized therein. Since the carrier gas that has flown through the bellows 98 and the carrier gas channel 94 in the valve bar 84 is injected from the carrier gas injection hole 92, the liquid source material is mixed with the carrier gas in the mixing channel 64 to become in the form of fine particles or mist and then introduced into the vaporization chamber 62 via the orifice plate 67 to be diffused and vaporized therein effectively.

When the supply of the source gas needs to be stopped, the valve port 66 is closed by making the diaphragm 74 sit on the valve seat 68 by way of driving the actuator 81 to move the valve bar 84 downward, as can be seen from FIG. 3. Accordingly, the liquid source material is not allowed to be introduced into the vaporization chamber 62. Since the carrier gas is constantly supplied even at this time, fine particles of the liquid source material remaining in a downstream area of the valve port 66, i.e., the mixing channel 64, the orifice plate 67 and the vaporization chamber 62, are vaporized and, hence, an unvaporized liquid source material does not remain in those areas.

Further, since the carrier gas injection hole 92 is provided at the central portion of the diaphragm 74, the carrier gas injection hole 92 faces the valve port 66 even when the valve port 66 is closed by the diaphragm 74, as shown in FIG. 3. Therefore, the carrier gas is supplied to all over the downstream side of the valve port 66, which prevents the occurrence of the dead space where the carrier gas does not reach. Accordingly, it is possible to almost completely vaporize unvaporized fine particles of the liquid source material that may exist in the downstream space of the valve port 66 so that the remaining of the unvaporized liquid source material can be almost completely prevented.

As a result, it is possible to avoid the clogging of passages and the generation of particles, both being caused by the remaining of the liquid source material in the conventional apparatus. Besides, since the source gas can be supplied stably, the production yield and the reproducibility of the CVD process can be maintained at a high level. Moreover, the carried gas discharged from the vaporizer 6 after closing the valve port 66, bypasses the processing chamber 8 via a bypass passage (not shown) connected with the vacuum exhaust system 14 and then is discarded without being supplied into the processing chamber 8.

Further, in accordance with this embodiment, the vaporization chamber 62 is disposed along the injection direction of the carrier gas from the carrier gas injection hole 92 so that, the liquid source material can be efficiently turned into fine particles. Furthermore, due to the presence of the orifice plate 67 in the mixing channel 64, the liquid source material can be efficiently turned into fine particles.

Although the stroke of the valve bar 84 involved in opening and closing the valve port 66 is only several tens of micrometers, it is possible to control a flow rate of the liquid source material to be supplied to the vaporization chamber 62 by adjusting a valve opening degree by way of controlling the stroke or controlling opening/closing time of the valve port 66.

Figure 6:
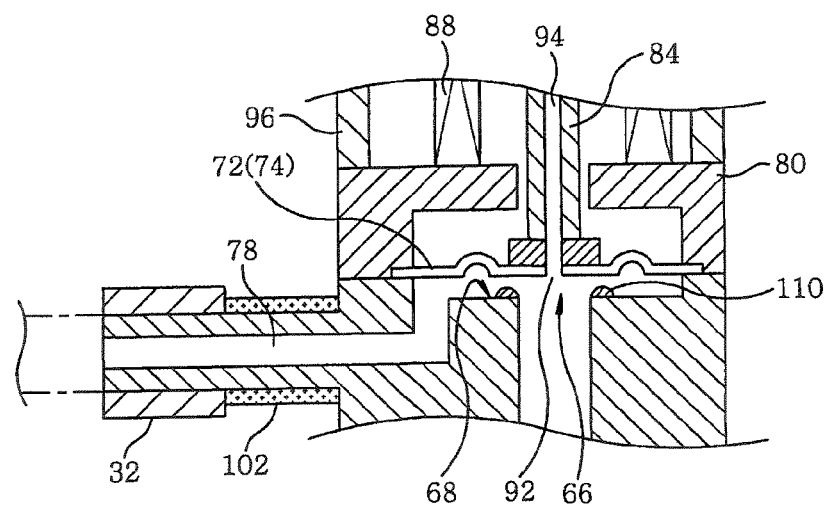
FIG. 6 depicts a partial cross sectional view of the vaporizer of the present invention which has a valve seat in accordance with a modified example.

In this embodiment, the valve seat 68 has a flat surface on which the diaphragm 74 sits, but it is not limited thereto. As can be seen from FIG. 6, a ring-shaped sealing protrusion 110 surrounding the valve port 66 may be formed at the valve seat 68, the sealing protrusion 110 having a semicircular cross section. Accordingly, the diaphragm 74 sits on the sealing protrusion 110 to more airtightly seal the valve port 66.

Figure 7:
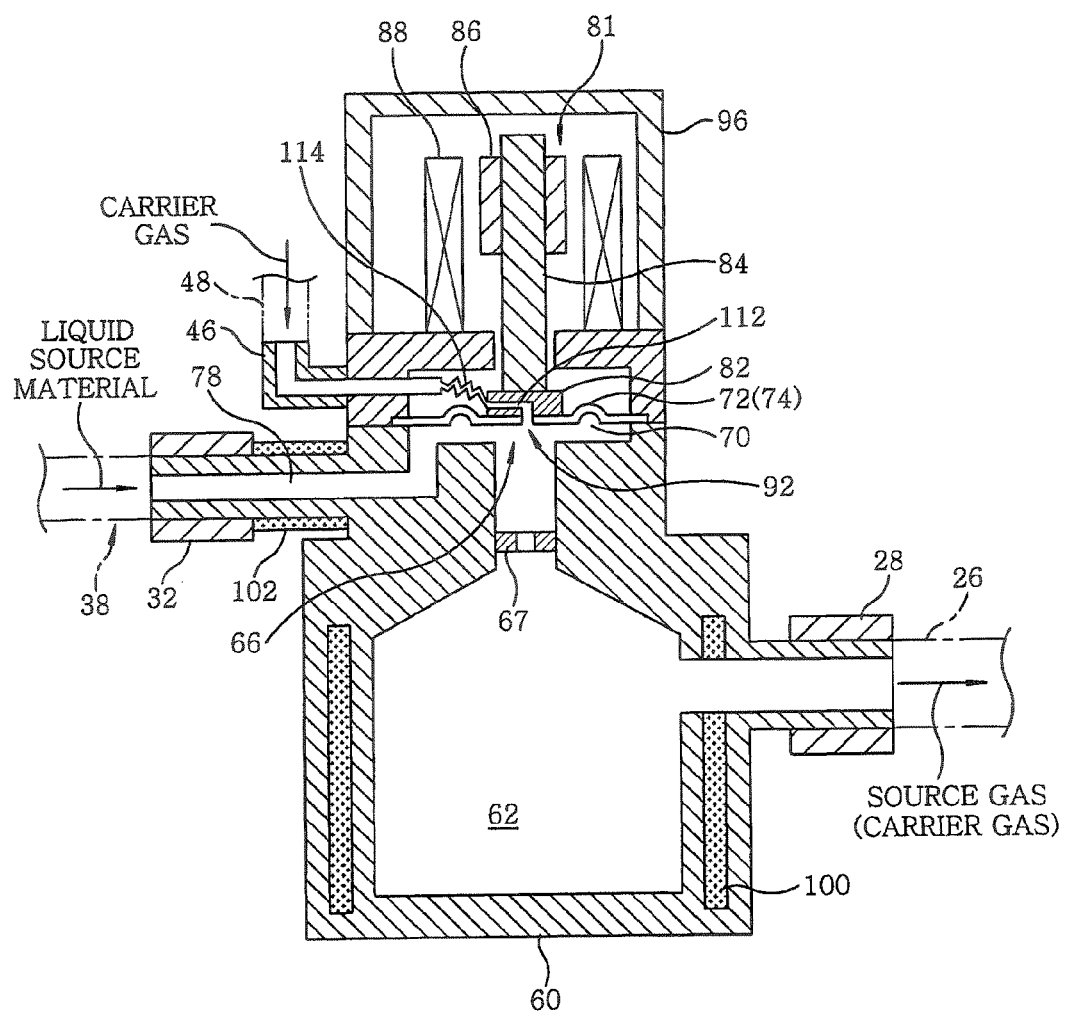
FIG. 7 offers a cross sectional view of the vaporizer of the present invention which has a carrier gas introduction unit in accordance with a modified example.

Moreover, the valve bar 84 in this embodiment has a bar shape so that the carrier gas channel 94 can be formed therein. However, without being limited thereto, a configuration of FIG. 7 may be employed for example. In FIGS. 1 and 7, like reference numerals represent like parts. Referring to FIG. 7 illustrating a modified example, as for the valve bar 84, a solid rod is used instead of a hollow pipe. In addition, a carrier gas inlet 46 is provided on a upper sidewall of the housing 60. And by a bellows 114 the carrier gas inlet 46 is connected with a flow path 112 formed at an attaching member 82 connected with a lower end of the valve bar 84. In this case as well, the carrier gas can be injected downward from the carrier gas injection hole 92 provided at a central portion of a diaphragm 74. Consequently, it is possible to obtain the operation effects same as those of the structure shown in FIG. 2.

Although the carrier gas injection hole 92 is provided at the central portion of the diaphragm 74 forming the valve body 72 in this embodiment, the carrier gas injection hole 92 can be disposed to be eccentric with respect to the central portion of the diaphragm 74 as long as the carrier gas injection hole 92 faces the valve port 66 when the valve port 66 is closed by the diaphragm 74.

Further, although an electromagnetic actuator is used as the actuator 81 in this embodiment, there can also be employed a multilayer piezoelectric actuator formed by laminating piezoelectric elements such as a piezo element and the like or an pneumatic actuator such as an air cylinder actuator or the like. Besides, the carrier gas is not limited to Ar gas and can be any gas as long as it does not react with the source gas. For example, He gas, $N_2$ gas, $H_2$ gas or the like may be used depending on the source gas.

A film forming liquid source material used in the apparatus of the present invention is not limited to $Cu(EDMDD)_2$ and may be another liquid source material, e.g., TEOS (tetraethoxysilane), Cu (hfac) TMVS (copper hexafluoro acetylacetonate tri methyl vinylsilane), TMA (tri methyl aluminum), TBTDET (tert butylimidotris (diethylamido) tantalum), PET (pent aethoxytantalum), $TiCl_4$ (titanium tetrachloride), TMS (tetra methylsilane), TEH (tetrakisethoxyhafnium) or the like.

A process performed by using a liquid source material in the apparatus of the present invention, is not limited to the film forming process. It may be a process for reducing a metal oxide film or a process for etching a metal film. When the process of reducing the metal oxide film is preformed, an organic reduction liquid source material is used. Further, when the etching process is carried out, a liquid trifluoroacetic acid, a hexafluoroacetylacetone, an acetic acid or the like are used as for a liquid source material. Besides, a target object is not limited to a semiconductor wafer and may be a glass substrate, an LCD substrate or the like.

What is claimed is:

1. A vaporizer for vaporizing a force-fed liquid source material in a depressurized atmosphere to generate a source gas and discharging the source gas together with a carrier gas, the vaporizer comprising:
    a liquid reservoir chamber for temporarily storing the force-fed liquid source material, the liquid reservoir chamber including a valve port;
    a vaporization chamber communicating with the liquid reservoir chamber via the valve port;
    a valve body which detachably sits on a valve seat surrounding the valve port;
    an actuator for driving the valve body;
    a carrier gas injection hole formed at the valve body, the carrier gas injection hole facing the valve port; and
    a discharge port for discharging the source gas from the vaporization chamber.

2. The vaporizer of claim 1, wherein the carrier gas injection hole is disposed to face the valve port even when the valve body sits on the valve seat.

3. The vaporizer of claim 1, wherein the vaporization chamber is disposed such that an injection direction of the carrier gas injected from the carrier gas injection hole is directed toward the vaporization chamber.

4. The vaporizer of claim 1, wherein the valve port is connected with the vaporization chamber via a mixing channel, and the liquid source material is mixed with the carrier gas and atomized in the mixing channel.

5. The vaporizer of claim 4, further comprising:
    an orifice plate installed in the mixing channel.

6. The vaporizer of claim 1, wherein the valve body is connected with a valve bar having therein a carrier gas channel through which the carrier gas supplied to the carrier gas injection hole flows.

7. The vaporizer of claim 1, wherein the valve body is a diaphragm made up of a bendable thin metal plate.

8. A processing apparatus for performing a specific process on a target object under a depressurized atmosphere, the processing apparatus comprising:
    a vacuum exhaustable processing chamber;
    a mounting table for mounting thereon the target object;
    a heating unit for heating the target object; and
    a vaporizer for vaporizing a force-fed liquid source material in the depressurized atmosphere to generate a source gas and discharging the source gas together with a carrier gas and supplying the source gas to the processing chamber, the vaporizer including:
    a liquid reservoir chamber for temporarily storing the force-fed liquid source material, the liquid reservoir chamber having a valve port;
    a vaporization chamber communicating with the liquid reservoir chamber via the valve port;
    a valve body which detachably sits on a valve seat surrounding the valve port;
    an actuator for driving the valve body;
    a carrier gas injection hole formed at the valve body, the carrier gas injection hole facing the valve port; and
    a discharge port for discharging the source gas from the vaporization chamber.

9. The vaporizer of claim 1, wherein the valve port opens when the valve body is detached from the valve seat so that the opened valve port allows the liquid source material to be introduced into the vaporization chamber, and
    wherein the valve port closes when the valve body sits on the valve seat so that the closed valve port prevents the liquid source material from being introduced into the vaporization chamber.

10. The vaporizer of claim 1, wherein the carrier gas injection hole is provided at a position where the carrier gas injection hole communicates with the vaporization chamber even when the valve port is closed by the valve body, so that the carrier gas is injected through the carrier gas injection hole to the vaporization chamber when the valve port is closed.

* * * * *